(12) United States Patent
Kim et al.

(10) Patent No.: US 9,397,286 B2
(45) Date of Patent: Jul. 19, 2016

(54) MAGNETIC MEMORY DEVICES HAVING PERPENDICULAR MAGNETIC TUNNEL STRUCTURES THEREIN

(71) Applicants: Sangyong Kim, Suwon-si (KR); Whankyun Kim, Seoul (KR); Sechung Oh, Yongin-si (KR)

(72) Inventors: Sangyong Kim, Suwon-si (KR); Whankyun Kim, Seoul (KR); Sechung Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/473,334

(22) Filed: Aug. 29, 2014

(65) Prior Publication Data

US 2015/0137287 A1    May 21, 2015

(30) Foreign Application Priority Data

Nov. 18, 2013   (KR) .................. 10-2013-0140135

(51) Int. Cl.
*H01L 29/82* (2006.01)
*H01L 43/08* (2006.01)
*H01L 43/02* (2006.01)

(52) U.S. Cl.
CPC ............... *H01L 43/08* (2013.01); *H01L 43/02* (2013.01)

(58) Field of Classification Search
CPC ............................... H01L 43/02; H01L 43/08
USPC ........................................... 257/421
See application file for complete search history.

(56) References Cited

U.S. PATENT DOCUMENTS

| | | |
|---|---|---|
| 6,185,079 B1 | 2/2001 | Gill |
| 7,351,594 B2 | 4/2008 | Bae et al. |
| 7,379,280 B2 | 5/2008 | Fukumoto et al. |
| 7,825,000 B2 | 11/2010 | Kanakasabapathy et al. |
| 8,064,244 B2 | 11/2011 | Zhang et al. |
| 8,143,684 B2 | 3/2012 | Nagamine et al. |
| 8,405,174 B2 | 3/2013 | Ranjan et al. |
| 2011/0014500 A1 | 1/2011 | Horng et al. |
| 2011/0031569 A1 | 2/2011 | Watts et al. |
| 2011/0049656 A1 | 3/2011 | Li et al. |
| 2011/0108937 A1 | 5/2011 | Reid |
| 2012/0012952 A1 | 1/2012 | Chen et al. |
| 2013/0043471 A1 | 2/2013 | Cao et al. |
| 2014/0021426 A1* | 1/2014 | Lee .................. H01L 43/02 257/1 |

FOREIGN PATENT DOCUMENTS

KR    1020090056535 A    6/2009

* cited by examiner

*Primary Examiner* — Douglas Menz
(74) *Attorney, Agent, or Firm* — Myers Bigel & Sibley, P.A.

(57) ABSTRACT

Magnetic memory cells include a magnetic tunnel junction and a first electrode, which is electrically coupled to the magnetic tunnel junction by a first conductive structure. This conductive structure includes a blocking layer and a seed layer, which extends between the blocking layer and the magnetic tunnel junction. The blocking layer is formed as an amorphous metal compound. In some of the embodiments, the blocking layer is a thermally treated layer and an amorphous state of the blocking layer is maintained during and post thermal treatment.

12 Claims, 8 Drawing Sheets

MAGNETIC MEMORY DEVICES HAVING PERPENDICULAR MAGNETIC TUNNEL STRUCTURES THEREIN

REFERENCE TO PRIORITY APPLICATION

This U.S. non-provisional patent application claims priority under 35 U.S.C. §119 to Korean Patent Application No. 10-2013-0140135, filed Nov. 18, 2013 in the Korean Intellectual Property Office, the disclosure of which is hereby incorporated herein by reference in its entirety.

BACKGROUND

The inventive concepts relate to magnetic memory devices and, more particularly, to magnetic memory devices having perpendicular magnetic tunnel junctions therein.

High speed and/or low voltage semiconductor memory devices have been demanded with the development of high speed and/or low power consumption electronic devices including semiconductor memory devices. To satisfy these demands, a magnetic memory device has been suggested. The magnetic memory device has high speed and/or non-volatile characteristics, so as to be spotlighted as a next generation semiconductor memory device.

Generally, the magnetic memory device may include a magnetic tunnel junction (MTJ) pattern. The MTJ pattern may include two magnetic layers and an insulating layer disposed therebetween. A resistance value of the MTJ pattern may be changed depending on magnetization directions of the two magnetic layers. For example, if the magnetization directions of the two magnetic layers are anti-parallel to each other, the MTJ pattern may have a high resistance value. If the magnetization directions of the two magnetic layers are parallel to each other, the MTJ pattern may have a low resistance value. Logical data may be written/read using a difference between the high and low resistance values of the MTJ pattern.

High integrated and/or low power consumption magnetic memory devices have been increasingly demanded with the development of an electronic industry. Thus, various researches are being conducted for magnetic memory devices capable of satisfying the demands.

SUMMARY

Magnetic memory devices according to embodiments of the invention can include an array of magnetic memory cells electrically connected to respective word and bit lines. According to some of these embodiments of the invention, a magnetic memory cell can include a magnetic tunnel junction (MTJ) and a first electrode electrically coupled to the magnetic tunnel junction by a first conductive structure. This first conductive structure may include a blocking layer and a seed layer, which extends between the blocking layer and the magnetic tunnel junction. The blocking layer may be formed as or at least include an amorphous metal compound material.

In some embodiments of the invention, the blocking layer is deposited, patterned and thermally treated. Moreover, an amorphous state of the blocking layer is preferably maintained during and post thermal treatment. The blocking layer may include ferromagnetic, non-metal and non-magnetic metal elements, for example. The non-metal element may be selected from a group consisting of boron and nitrogen and combinations thereof. A content ratio of the non-magnetic metal element in the blocking layer may be in a range from about 15 wt % to about 50 wt %.

A magnetic memory device according to additional embodiments of the invention may include first and second perpendicular magnetic structures (MS1, MS2) having a tunnel barrier layer therebetween. An electrode is provided, which is separated from the tunnel barrier layer by the first perpendicular magnetic structure. A blocking layer is provided, which extends between the first perpendicular magnetic structure and the electrode. The blocking layer includes an amorphous metal compound. This blocking layer is typically a thermally treated layer, and an amorphous state of the blocking layer is maintained during the thermal treatment after the thermal treatment. The blocking layer may be formed from ferromagnetic, non-metal and non-magnetic metal elements.

In some embodiments of the invention, the ferromagnetic element is selected from a group consisting of cobalt, iron and nickel and combinations thereof, whereas the non-metal element is selected from a group consisting of boron and nitrogen and combinations thereof. The non-magnetic metal element may be selected from a group consisting of tantalum (Ta), tungsten (W), niobium (Nb), titanium (Ti), chromium (Cr), zirconium (Zr), hafnium (Hf), molybdenum (Mo), aluminum (Al), magnesium (Mg), ruthenium (Ru) and vanadium (V) and combinations thereof. For example, the blocking layer may be formed as a cobalt-iron-boron-tantalum (CoFeBTa) layer in some embodiments of the invention. In still further embodiments of the invention, a content ratio of the non-magnetic metal element in the blocking layer is in a range from about 15 wt % to about 50 wt %. The blocking layer may be formed to have a thickness in a range from about 0.1 Å to about 20 Å.

According to still further embodiments of the invention, a seed layer may be provided, which extends between the first perpendicular magnetic structure and the blocking layer. The blocking layer may contact the seed layer. The first perpendicular magnetic structure may also include: (i) an exchange coupling layer, which extends between the tunnel barrier layer and the seed layer; (ii) a first magnetic layer having a fixed magnetization direction, which extends between the tunnel barrier layer and the exchange coupling layer; and (iii) a second magnetic layer having a fixed magnetization direction, which extends between the exchange coupling layer and the seed layer. In additional embodiments of the invention, the first perpendicular magnetic structure includes a magnetic layer having a changeable magnetization direction, which extends between the tunnel barrier layer and the seed layer.

According to further embodiments of the invention, the electrode is a first electrode and the blocking layer is a first blocking layer, and the memory device further includes: (i) a second electrode spaced apart from the tunnel barrier layer with the second perpendicular magnetic structure extending therebetween; and (ii) a second blocking layer extending between the second perpendicular magnetic structure and the second electrode. This second blocking layer may include an amorphous metal compound. This memory device may also include a seed layer extending between the first perpendicular magnetic structure and the first blocking layer and a capping layer extending between the second perpendicular magnetic structure and the second blocking layer. The first blocking layer may be in contact with a surface of the seed layer and the second blocking may be in contact with one surface of the capping layer.

A magnetic memory device according to additional embodiments of the invention may include a magnetic tunnel junction including a free layer, a pinned layer, and a tunnel barrier between the free layer and the pinned layer, an electrode on the magnetic tunnel junction, and a blocking layer between the magnetic tunnel junction and the electrode. A saturation magnetization value of the blocking layer is smaller than saturation magnetization values of magnetic layers constituting the magnetic tunnel junction.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
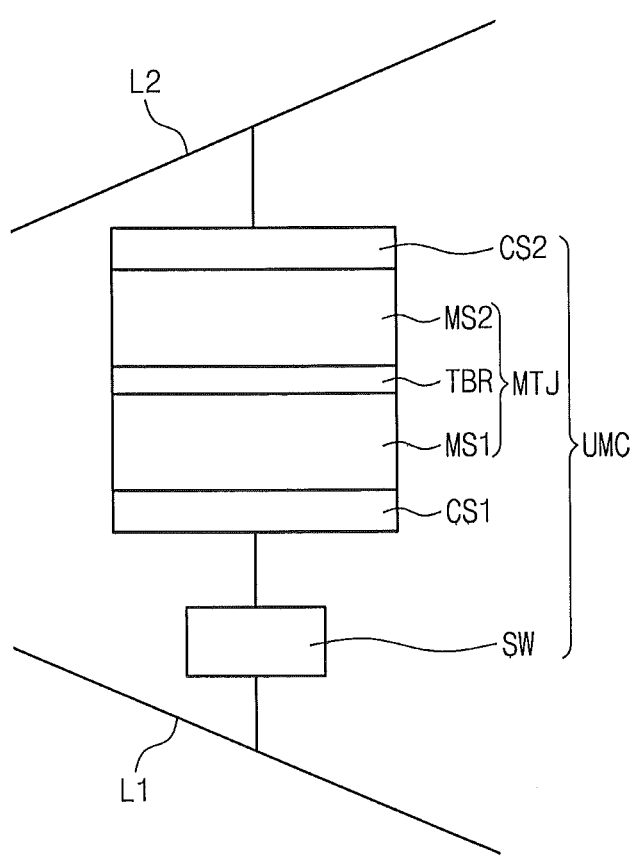
FIG. 1 is a circuit diagram illustrating a unit memory cell of a magnetic memory device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a circuit diagram illustrating a unit memory cell of a magnetic memory device according to example embodiments of the inventive concepts. Referring to FIG. 1, a unit memory cell UMC is disposed between a first interconnection L1 and a second interconnection L2 crossing each other. The unit memory cell UMC is connected to the first and second interconnections L1 and L2. The unit memory cell UMC may include a switching component SW and a magnetic tunnel junction MTJ. The switching component SW and the magnetic tunnel junction MTJ may be electrically connected in series to each other. One of the first and second interconnections L1 and L2 may be used as a word line, and the other of the first and second interconnections L1 and L2 may be used as a bit line.

The switching component SW may be configured to selectively control a flow of charges passing through the magnetic tunnel junction MTJ. For example, the switching component SW may be one of a diode, a PNP bipolar transistor, an NPN bipolar transistor, an NMOS field effect transistor, and a PMOS field effect transistor. If the switching component SW is a three-terminal element such as the bipolar transistor or the MOS field effect transistor, an additional interconnection (not shown) may be connected to the switching component SW.

The magnetic tunnel junction MTJ may include a first perpendicular magnetic structure MS1, a second perpendicular magnetic structure MS2, and a tunnel barrier TBR disposed between the first and second perpendicular magnetic structures MS1 and MS2. Each of the first and second perpendicular magnetic structures MS1 and MS2 may include at least one magnetic layer formed of a magnetic material. In some embodiments, the unit memory cell UMC may further include a first conductive structure CS1 disposed between the first perpendicular magnetic structure MS1 and the switching component SW and a second conductive structure CS2 disposed between the second perpendicular magnetic structure MS2 and the second interconnection L2, as illustrated in FIG. 1.

Figure 2:
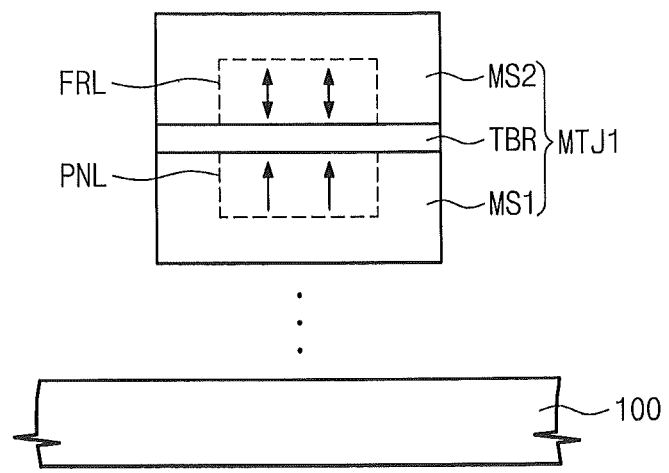
FIGS. 2 and 3 are diagrams illustrating magnetic tunnel junctions according to example embodiments of the inventive concepts.
Figure 3:
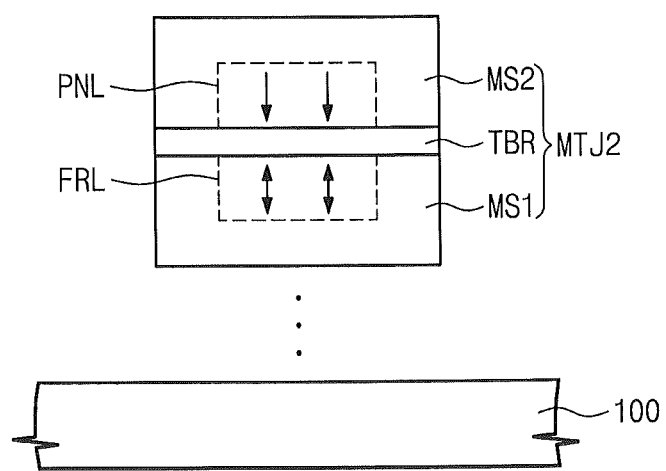

FIGS. 2 and 3 are diagrams illustrating magnetic tunnel junctions according to example embodiments of the inventive concepts. Referring to FIGS. 2 and 3, a magnetization direction of one of the magnetic layer of the first perpendicular magnetic structure MS1 and the magnetic layer of the second perpendicular magnetic structure MS2 is fixed regardless of an external magnetic field under a normal usage environment. Hereinafter, the magnetic layer having this fixed magnetization property is defined as a pinned layer PNL. A magnetization direction of the other of the magnetic layers of the first and second perpendicular magnetic structures MS1 and MS2 may be switched by an applied external magnetic field or spin transfer torque of electrons in a program current. Hereinafter, the magnetic layer having this switchable magnetization property is defined as a free layer FRL. The magnetic tunnel junction MTJ may include at least one free layer FRL and at least one pinned layer PNL separated from the at least one free layer FRL by the tunnel barrier TBR.

An electrical resistance of the magnetic tunnel junction MTJ may be dependent on the magnetization directions of the free layer FRL and the pinned layer PNL. For example, the magnetic tunnel junction MTJ may have a first electrical resistance when the magnetization directions of the free layer FRL and the pinned layer PNL are parallel to each other, and the magnetic tunnel junction MTJ may have a second electrical resistance greater than the first electrical resistance when the magnetization directions of the free layer FRL and the pinned layer PNL are anti-parallel to each other. As a result, the electrical resistance of the magnetic tunnel junction MTJ may be controlled by changing the magnetization direction of the free layer FRL. This may be used as a data storing principle of the magnetic memory device according to embodiments of the inventive concepts.

The first and second perpendicular magnetic structures MS1 and MS2 of the magnetic tunnel junction MTJ may be sequentially stacked on a substrate 100, as illustrated in FIGS. 2 and 3. In this case, the magnetic tunnel junction MTJ may be one of two types according to a relative position between the free layer FRL and the substrate 100 and/or a formation order of the free layer FRL and the pinned layer PNL. In some embodiments, the magnetic tunnel junction MTJ may be a first type magnetic tunnel junction MTJ1 of which first and second perpendicular magnetic structures MS1 and MS2 include the pinned layer PNL and the free layer FRL, respectively, as illustrated in FIG. 2. In other embodiments, the magnetic tunnel junction MTJ may be a second type magnetic tunnel junction MTJ2 of which first and second perpendicular magnetic structures MS1 and MS2 include the free layer FRL and the pinned layer PNL, respectively, as illustrated in FIG. 3.

Figure 4:
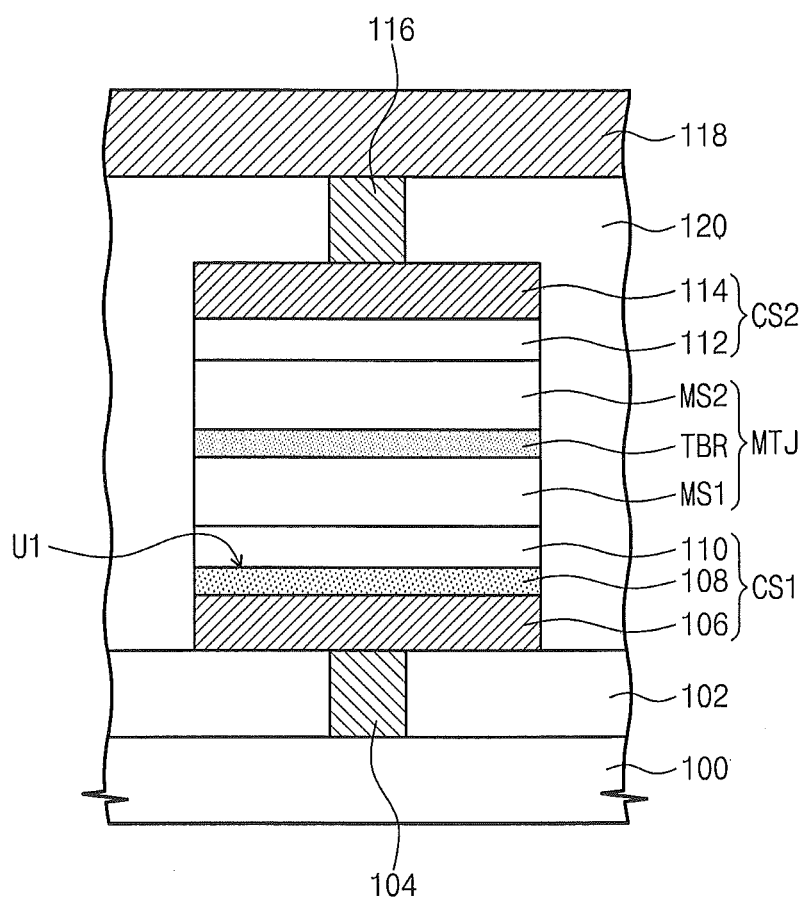
FIG. 4 is a cross-sectional view illustrating a magnetic memory device according to some embodiments of the inventive concepts.

FIG. 4 is a cross-sectional view illustrating a magnetic memory device according to some embodiments of the inventive concepts. Referring to FIG. 4, a first dielectric layer 102 may be disposed on a substrate 100, and a lower contact plug 104 may penetrate the first dielectric layer 102. A bottom surface of the lower contact plug 104 may be electrically connected to one terminal of a switching component. The substrate 100 may include at least one of materials having a semiconductor property, insulating materials, a semiconductor covered with an insulating material, and a conductor covered with an insulating material. In some embodiments, the substrate 100 may be a silicon wafer. The first dielectric layer 102 may include an oxide (e.g., silicon oxide), a nitride (e.g., silicon nitride), and/or an oxynitride (e.g., silicon oxynitride). The lower contact plug 104 may include a conductive material. For example, the lower contact plug 104 may include at least one of a semiconductor doped with dopants (e.g., doped silicon, doped germanium, or doped silicon-germanium), a metal (e.g., titanium, tantalum, or tungsten), and a conductive metal nitride (e.g., titanium nitride or tantalum nitride).

A first conductive structure CS1, a magnetic tunnel junction MTJ, and a second conductive structure CS2 may be sequentially stacked on the first dielectric layer 102. The first conductive structure CS1 may be electrically connected to a top surface of the lower contact plug 104. The first conductive structure CS1, the magnetic tunnel junction MTJ, and the second conductive structure CS2 may have sidewalls aligned with each other.

The first conductive structure CS1 may include a first electrode 106 on the first dielectric layer 102, a seed layer 110 on the first electrode 106, and a blocking layer 108 between the first electrode 106 and the seed layer 110. The magnetic tunnel junction MTJ may include a first perpendicular magnetic structure MS1 on the seed layer 110, a second perpendicular magnetic structure MS2 on the first perpendicular magnetic structure MS1, and a tunnel barrier TBR between the first and second perpendicular magnetic structures MS1 and MS2. In more detail, the first perpendicular magnetic structure MS1 may be disposed between the seed layer 110 and the tunnel barrier TBR, and the second perpendicular magnetic structure MS1 may be disposed between the tunnel barrier TBR and the second conductive structure CS2. The second conductive structure CS2 may include a second electrode 114 on the second perpendicular magnetic structure MS2, and a capping layer 112 between the second perpendicular magnetic structure MS2 and the second electrode 114.

The first electrode 106 may be electrically connected to the top surface of the lower contact plug 104. The first electrode 106 may include a conductive material having a predetermined crystal structure. In some embodiments, the first electrode 106 may include a conductive metal nitride such as titanium nitride and/or tantalum nitride. The blocking layer 108 may include an amorphous metal compound. Hereinafter, a metal compound means a material composed of a metal element and a different element from the metal element. The blocking layer 108 may be in an amorphous state when the blocking layer 108 is deposited. Additionally, the amorphous state of the blocking layer 108 may be maintained after an annealing process performed after the deposition of the blocking layer 108.

In a first embodiment, the blocking layer 108 may be a thin layer including a metal compound composed of a ferromagnetic element, a non-metal element, and a non-magnetic metal element. The ferromagnetic element may include at least one of cobalt, iron, and nickel. The non-metal element may include at least one of boron, nitrogen, and oxygen. The non-magnetic metal element may include at least one of tantalum (Ta), tungsten (W), niobium (Nb), titanium (Ti), chrome (Cr), zirconium (Zr), hafnium (Hf), molybdenum (Mo), aluminum (Al), magnesium (Mg), ruthenium (Ru), and vanadium (V). In some embodiments, the blocking layer 108 may include cobalt-iron-boron-tantalum (CoFeBTa). In this case, a saturation magnetization (Ms) value of the blocking layer 108 may be smaller than saturation magnetization values of magnetic layers included in the magnetic tunnel junction MTJ. In some embodiments, the saturation magnetization value of the blocking layer 108 may be about 10 emu/cm$^3$ or less.

A content ratio of the non-magnetic metal element in the blocking layer 108 may be in a range of about 15 wt % to about 50 wt %. If the content ratio of the non-magnetic metal element is smaller than about 15 wt %, it is difficult to reduce the saturation magnetization value of the blocking layer 108. Additionally, the blocking layer 108 may be crystallized by the annealing process such that it is difficult to maintain the amorphous state of the blocking layer 108. If the content ratio of the non-magnetic metal element is greater than about 50 wt %, the blocking layer 108 may also be crystallized by the annealing process such that it is difficult to maintain the amorphous state of the blocking layer 108.

In a second embodiment, the blocking layer 108 may be a thin layer including a metal compound composed of a non-magnetic metal element and an oxygen element. The non-magnetic metal element may include at least one of tantalum (Ta), tungsten (W), niobium (Nb), titanium (Ti), chrome (Cr), zirconium (Zr), hafnium (Hf), molybdenum (Mo), aluminum (Al), magnesium (Mg), ruthenium (Ru), and vanadium (V). In some embodiments, the blocking layer 108 may include ruthenium oxide(RuOx). In this case, the blocking layer 108 may be a non-magnetic layer. In other words, a saturation magnetization value of the blocking layer 108 may be 0 (zero) emu/cm$^3$. In still other embodiments, the blocking layer 108 may have a multi-layered structure including one thin layer of the first embodiment described above and one thin layer of the second embodiment described above.

A thickness of the blocking layer 108 may be in a range from about 0.1 Å to about 20 Å. In some embodiments, even though the blocking layer 108 is deposited with a thickness of about 20 Å or less, the blocking layer 108 may not be crystallized by the annealing process but the amorphous state of the blocking layer 108 may be maintained. The blocking layer 108 may have a planarized top surface U1 by a planarization process which is performed after the deposition of the blocking layer 108 and before deposition of the seed layer 110.

Generally, the first electrode 106 may have a predetermined crystal structure and may be adjacent to the seed layer 110 with a metal layer therebetween. The metal layer may be in an amorphous state during a deposition process but may then be crystallized by an annealing process performed after the deposition process. Thus, the crystal structure of the first electrode 106 may be transferred to the seed layer 110 through the metal layer. The transferred crystal structure may influence a crystal structure and orientation of the magnetic tunnel junction MTJ formed using the seed layer 110 as a seed. As a result, a tunnel magnetic resistance (TMR) characteristic of the magnetic tunnel junction MTJ may be deteriorated. Additionally, an exchange coupling characteristic between magnetic layers in the magnetic tunnel junction MTJ may also be deteriorated.

According to embodiments of the inventive concepts, the blocking layer 108 including the amorphous metal compound may not be crystallized by the annealing process performed after the deposition of the blocking layer 108 such that the amorphous state of the blocking layer 108 may be maintained after the annealing process. Since the blocking layer 108 is disposed between the first electrode 106 and the seed layer 110, it is possible to prevent the crystal structure of the first electrode 106 from being transferred to the seed layer 110 by the annealing process. In other words, it is possible to prevent the crystal structure of the first electrode 106 from influencing the crystal structure and the orientation of the magnetic tunnel junction MTJ through the seed layer 110 by the annealing process. Thus, the TMR characteristic and the exchange coupling characteristic of the magnetic tunnel junction MTJ may be improved.

The seed layer 110 may include a material capable of promoting crystal growth of the magnetic layers included in the magnetic tunnel junction MTJ. In some embodiments, the seed layer 110 may include metal atoms constituting a hexagonal close packed (HCP) lattice. For example, the seed layer 110 may include at least one of ruthenium (Ru) and titanium (Ti). In other embodiments, the seed layer 110 may include metal atoms constituting a face-centered cubic (FCC) lattice. For example, the seed layer 110 may include at least one of platinum (Pt), palladium (Pd), gold (Au), silver (Ag), copper (Cu), and aluminum (Al). The seed layer 110 may have a single layer. Alternatively, the seed layer 110 may include a plurality of layers having different crystal structures from each other.

Figure 7:
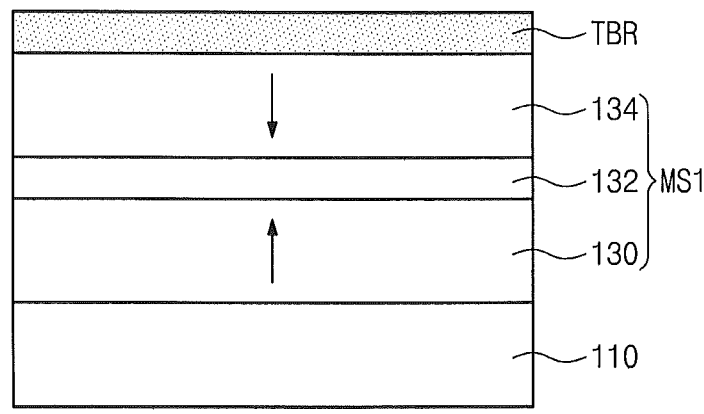
FIGS. 7 and 8 are cross-sectional views illustrating examples of a first perpendicular magnetic structure constituting a portion of a magnetic tunnel junction according to embodiments of the inventive concepts.
Figure 8:
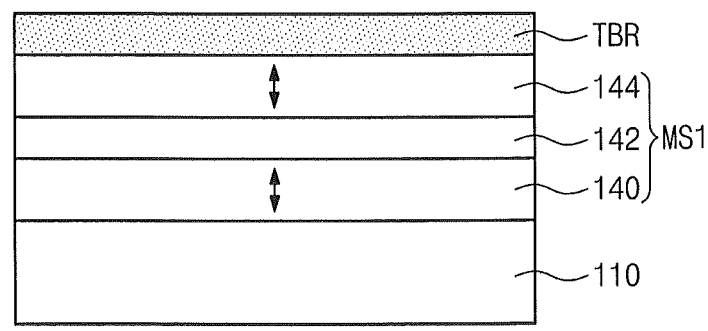

FIGS. 7 and 8 are cross-sectional views illustrating examples of a first perpendicular magnetic structure constituting a portion of a magnetic tunnel junction according to embodiments of the inventive concepts. Referring to FIG. 7, the first perpendicular magnetic structure MS1 may include a first pinned layer 130, a first exchange coupling layer 132 and a second pinned layer 134 which are sequentially stacked between the seed layer 110 and the tunnel barrier TBR. The first perpendicular magnetic structure MS1 according to the present embodiment may be a multi-layered magnetic structure including the pinned layer PNL included in the first type magnetic tunnel junction MTJ1 described with reference to FIG. 2.

In more detail, the first pinned layer 130 may be disposed between the seed layer 110 and the first exchange coupling layer 132, and the second pinned layer 134 may be disposed between the first exchange coupling layer 132 and the tunnel barrier TBR. The first pinned layer 130 may be formed of a magnetic material having an intrinsic perpendicular magnetization property (hereinafter, referred to as 'a perpendicular magnetic material). Here, the intrinsic perpendicular magnetization property means that a magnetic layer has a magnetization direction parallel to a thickness direction of the magnetic layer when external factors do not exist. In some embodiments, if the magnetic layer having the intrinsic perpendicular magnetization property is formed on a substrate, the magnetization direction of the magnetic layer may be substantially perpendicular to a top surface of the substrate.

The intrinsic perpendicular magnetization property of the first pinned layer 130 may be realized by a single-layered or multi-layered structure including at least one of perpendicular magnetic materials including cobalt. In some embodiments, the first pinned layer 130 may have a single-layered or multi-layered structure including a cobalt-platinum alloy or a cobalt-platinum alloy including a composition X. The composition X may include at least one of boron, ruthenium, chrome, tantalum, and an oxide. In other embodiments, the first pinned layer 130 may have a multi-layered structure including cobalt-containing layers and noble metal layers which are alternately and repeatedly stacked. In this case, the cobalt-containing layers may be formed of one of cobalt, cobalt-iron, cobalt-nickel, and cobalt-chrome, and the noble metal layers may be formed of one of platinum and palladium. In still other embodiments, the first pinned layer 130 may have a multi-layered structure including one structure of the some embodiments described above and one structure of the other embodiments described above.

In some embodiments, a thickness of the first pinned layer 130 may be in a range of about 20A to about 80A. More particularly, the thickness of the first pinned layer 130 may be in a range of about 30A to about 55A. The aforementioned materials of the first pinned layer 130 were described as examples of the materials having the intrinsic perpendicular magnetization property of the first pinned layer 130. However, the inventive concepts are not limited thereto. In other embodiments, the first pinned layer 130 may include cobalt-iron-terbium (CoFeTb) including terbium having a content ratio of about 10% or more, cobalt-iron-gadolinium (CoFeGd) including gadolinium (Gd) having a content ratio of about 10% or more, cobalt-rion-dysprosium (CoFeDy), iron-platinum (FePt) having an $L1_0$ structure, iron-palladium (FePd) having the $L1_0$ structure, cobalt-palladium (CoPd) having the $L1_0$ structure, cobalt-platinum (CoPt) having an $L1_0$ or $L1_1$ structure, cobalt-platinum (CoPt) having a hexagonal close packed (HCP) structure, or any alloy including at least one thereof. In still other embodiments, the first pinned layer 130 may have a structure including alternately and repeatedly stacked magnetic layers and non-magnetic layers. The structure including alternately and repeatedly stacked magnetic layers and non-magnetic layers may be one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n (where "n" is a natural number equal to or greater than 2). In some embodiments, the first pinned layer 130 may further include a cobalt layer or cobalt-rich layer which is in contact with the first exchange coupling layer 132.

The first exchange coupling layer 132 may be formed of at least one of ruthenium, iridium, and rhodium. According to embodiments of the inventive concepts, the second pinned layer 134 may have a magnetization direction parallel to a thickness direction of the second pinned layer 134 due to antiferromagnetic exchange coupling which is induced between the first and second pinned layers 130 and 134 by the first exchange coupling layer 132. Thus, the magnetization direction of the second pinned layer 134 may be. The first exchange coupling layer 132 may have a thickness capable of changing the magnetic direction of the second pinned layer 134 into a direction anti-parallel to the magnetization direction of the first pinned layer 130. In some embodiments, the thickness of the first exchange coupling layer 132 may be in a range of about 2 Å to about 10 Å.

The second pinned layer 134 may be formed of a magnetic material having an intrinsic horizontal magnetization property. Here, the intrinsic horizontal magnetization property means that a magnetic layer has a magnetization direction parallel to a longitudinal direction of the magnetic layer when external factors do not exist. In some embodiments, if a magnetic layer having the intrinsic horizontal magnetization property is formed on a substrate, the magnetization direction of the magnetic layer may be substantially parallel to the top surface of the substrate. In other words, the second pinned layer 134 may have a magnetization direction parallel to the widest surface of the second pinned layer 134 when external factors do not exist.

In some embodiments, the intrinsic horizontal magnetization property of the second pinned layer 134 may be realized by a single-layered or multi-layered structure including at least one of cobalt, iron, and alloys thereof. For example, the second pinned layer 134 may have a single-layered or multi-layered structure including at least one of cobalt-iron-boron (CoFeB), cobalt-hafnium (CoHf), cobalt (Co), and cobalt-zirconium (CoZr). In more detail, the second pinned layer 134 may have a multi-layered structure including a cobalt (Co) layer and a cobalt-hafnium (CoHf) layer, or a multi-layered structure including a cobalt-iron-boron (CoFeB) layer. These materials are just examples of the material having the intrinsic horizontal magnetization property of the second pinned layer 134. However, the inventive concepts are not limited thereto. In some embodiments, a thickness of the second pinned layer 134 may be in a range of about 7 Å to about 25 Å, In particular, the thickness of the second pinned layer 134 may be in a range of about 10 Å to about 17 Å.

A horizontal magnetization direction of the second pinned layer 134 having the intrinsic horizontal magnetization property may be changed into a perpendicular magnetization direction by an external factor. In some embodiments, the second pinned layer 134 may be in contact with the tunnel barrier TBR. Thus, the second pinned layer 134 may become a structure having an extrinsic perpendicular magnetization property by the tunnel barrier TBR.

In more detail, the second pinned layer 134 may become the structure having the extrinsic perpendicular magnetization property (hereinafter, referred to as 'an extrinsic perpendicular structure') by interface anisotropy caused at a contact interface of the second pinned layer 134 and the tunnel barrier TBR. If the tunnel barrier TBR includes magnesium oxide (MgO) and the second pinned layer 134 include cobalt-iron-boron (CoFeB), the interface anisotropy may be caused by combination of the oxygen of the tunnel barrier TBR and the iron (Fe) element of the second pinned layer 134. A non-metal element (e.g., boron (B)) in the second pinned layer 134 may be exhausted through the interface between the tunnel barrier TBR and the second pinned layer 134 to accelerate the combination of the oxygen and the iron.

The interface anisotropy of the second pinned layer 134 may be induced by an additional thermal treatment process performed after the deposition of the second pinned layer 134. In other words, at least a portion of the second pinned layer 134 may be in an amorphous state during the deposition process of the second pinned layer 134, and the second pinned layer 134 may be then transformed into the extrinsic perpendicular structure by the thermal treatment process. In this case, a crystal structure of the second pinned layer 134 may be transformed by influence of a crystal structure of the tunnel barrier TBR. For example, if the tunnel barrier TBR has a sodium chloride (NaCl) crystal structure, the crystal structure of the second pinned layer 134 may be transformed into a body-centered cubic (BCC) crystal structure similar to the NaCl crystal structure. In other words, a <001> crystal plane of the tunnel barrier TBR may be in contact with a <001> crystal plane of the second pinned layer TBR to form the interface. The adjustment of the interface crystal plane of the tunnel barrier TBR and the second pinned layer 134 may improve a magnetic resistance ratio of the magnetic tunnel junction.

Referring to FIG. 8, the first perpendicular magnetic structure MS1 may include a first free layer 140, a second exchange coupling layer 142, and a second free layer 144 which are sequentially stacked between the seed layer 110 and the tunnel barrier TBR. The first perpendicular magnetic structure MS1 according to the present embodiment may be a multi-layered magnetic structure including the free layer FRL of the second type magnetic tunnel junction MTJ2 described with reference to FIG. 3.

In more detail, the first free layer 140 may be disposed between the seed layer 110 and the second exchange coupling layer 142, and the second free layer 144 may be disposed between the second exchange coupling layer 142 and the tunnel barrier TBR. The second free layer 144 may be formed of a magnetic material having an intrinsic horizontal magnetization property. In some embodiments, the intrinsic horizontal magnetization property of the second free layer 144 may be realized by a singled-layered or multi-layered structure including at least one of cobalt, iron, and alloys thereof. For example, the second free layer 144 may have a single-layered or multi-layered structure including at least one of cobalt-iron-boron (CoFeB), cobalt-hafnium (CoHf), cobalt (Co), and cobalt-zirconium (CoZr). In more detail, the second free layer 144 may have a multi-layered structure including a cobalt (Co) layer and a cobalt-hafnium (CoHf) layer, or a multi-layered structure including a cobalt-iron-boron (CoFeB) layer.

A horizontal magnetization direction of the second free layer 144 having the intrinsic horizontal magnetization property may be changed into a perpendicular magnetization direction by an external factor. In some embodiments, the second free layer 144 may be in contact with the tunnel barrier TBR. Thus, the second free layer 144 may become a structure having an extrinsic perpendicular magnetization property (hereinafter, referred to as 'an extrinsic perpendicular structure') by interface anisotropy caused by the contact of the tunnel barrier TBR and the second free layer 144. The second exchange coupling layer 142 may be a non-magnetic metal layer. For example, the second exchange coupling layer 142 may be formed of at least one of tantalum, ruthenium, iridium, and rhodium. The second free layer 144 may be antiferromagnetically exchange-coupled to the first free layer 140 by the second exchange coupling layer 142.

The first free layer 140 may include the same material as the second free layer 144. For example, the perpendicular magnetic structure MS1 may include a pair of free layers 140 and 144 formed of an alloy of cobalt-iron-boron (CoFeB), and the second exchange coupling layer 142 formed of tantalum between the pair of free layers 140 and 144.

In other embodiments, the first free layer 140 may be formed of a magnetic material having an intrinsic perpendicular magnetization property. The intrinsic perpendicular magnetization property may be realized by a single-layered or multi-layered structure including at least one of perpendicular magnetic materials including cobalt. In some embodiments, the first free layer 140 may have a single-layered or multi-layered structure including a cobalt-platinum alloy, or a cobalt-platinum alloy including a composition X. The composition X may include at least one of boron, ruthenium, chrome, tantalum, and an oxide. In other embodiments, the first free layer 140 may have a multi-layered structure including cobalt-containing layers and noble metal layers which are alternately and repeatedly stacked. In this case, the cobalt-containing layers may be formed of cobalt, cobalt-iron, cobalt-nickel, or cobalt-chrome, and the noble metal layers may be formed of platinum or palladium. In still other embodiments, the first free layer 140 may have a multi-layered structure including one structure of the some embodiments described above and one structure of the other embodiments described above.

Referring again to FIG. 4, the tunnel barrier TBR may include at least one of magnesium oxide (MgO), titanium oxide (TiO), aluminum oxide (AlO), magnesium-zinc oxide (MgZnO), magnesium-boron oxide (MgBO), titanium nitride, and vanadium nitride (VN). In some embodiments, the tunnel barrier TBR may be a magnesium oxide (MgO) layer. Alternatively, the tunnel barrier TBR may include a plurality of layers.

Figure 9:
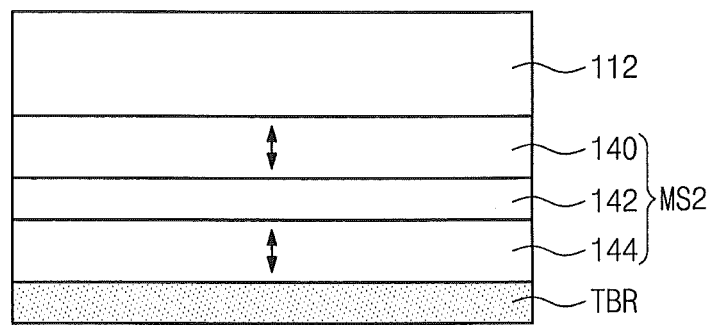
FIGS. 9 and 10 are cross-sectional views illustrating examples of a second perpendicular magnetic structure constituting a portion of a magnetic tunnel junction according to embodiments of the inventive concepts.
Figure 10:
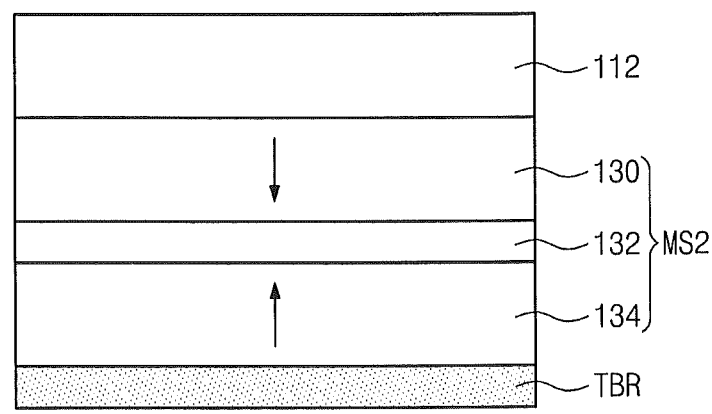

FIGS. 9 and 10 are cross-sectional views illustrating examples of a second perpendicular magnetic structure constituting a portion of a magnetic tunnel junction according to embodiments of the inventive concepts. Referring to FIG. 9, the second perpendicular magnetic structure MS2 may include a first free layer 140, a second exchange coupling layer 142, and a second free layer 144 which are disposed between the tunnel barrier TBR and the capping layer 112. The second perpendicular magnetic structure MS2 according to the present embodiment may be a multi-layered magnetic structure including the free layer FRL of the first type magnetic tunnel junction MTJ1 described with reference to FIG. 2.

In more detail, the first free layer 140 may be disposed between the capping layer 112 and the second exchange coupling layer 142, and the second free layer 144 may be disposed between the tunnel barrier TBR and the second exchange coupling layer 142. The first free layer 140 may be antiferromagnetically exchange-coupled to the second free layer 144 by the second exchange coupling layer 142. Other features of the first and second free layers 140 and 144 except their positions in the present embodiment may be the same as corresponding features of the first and second free layers 140 and 144 described with reference to FIG. 8. Thus, the detail descriptions thereto are omitted.

Referring to FIG. 10, the perpendicular magnetic structure MS2 may include a first pinned layer 130, a first exchange coupling layer 132, and a second pinned layer 134 which are disposed between the tunnel barrier TBR and the capping layer 112. The perpendicular magnetic structure MS2 according to the present embodiment may be a multi-layered magnetic structure including the pinned layer PNL of the second type magnetic tunnel junction MTJ2 described with reference to FIG. 3.

In some embodiments, the first pinned layer 130 may be disposed between the capping layer 112 and the first exchange coupling layer 132, and the second pinned layer 134 may be disposed between the tunnel barrier TBR and the first exchange coupling layer 132. The first pinned layer 130 may be antiferromagnetically exchange-coupled to the second pinned layer 134 by the first exchange coupling layer 132. Other features of the first and second pinned layers 130 and 134 except their positions in the present embodiment may be the same as corresponding features of the first and second pinned layers 130 and 134 described with reference to FIG. 7. Thus, the detail descriptions thereto are omitted.

Referring again to FIG. 4, the capping layer 112 may include at least one of tantalum (Ta), aluminum (Al), copper (Cu), gold (Au), silver (Ag), titanium (Ti), tantalum nitride (TaN), and titanium nitride (TiN). The second electrode 114 may include a conductive material. For example, the second electrode 114 may include a conductive metal nitride such as titanium nitride and/or tantalum nitride.

A second dielectric layer 120 may be disposed on an entire top surface of the substrate 100 to cover the first conductive structure CS1, the magnetic tunnel junction MTJ, and a second conductive structure CS2. The upper contact plug 116 may penetrate the second dielectric layer 120 so as to be connected to the second electrode 114. The second insulating layer 120 may include at least one of an oxide, a nitride, and an oxynitride. The upper contact plug 116 may include at least one of a metal (e.g., titanium, tantalum, copper, aluminum, or tungsten) and a conductive metal nitride (e.g., titanium nitride or tantalum nitride). An interconnection 118 may be disposed on the second dielectric layer 120. The interconnection 118 may be connected to the upper contact plug 116. The interconnection 118 may include at least one of a metal (e.g., titanium, tantalum, copper, aluminum, or tungsten) and a conductive metal nitride (e.g., titanium nitride or tantalum nitride). In some embodiments, the interconnection 118 may be a bit line.

Figure 5:
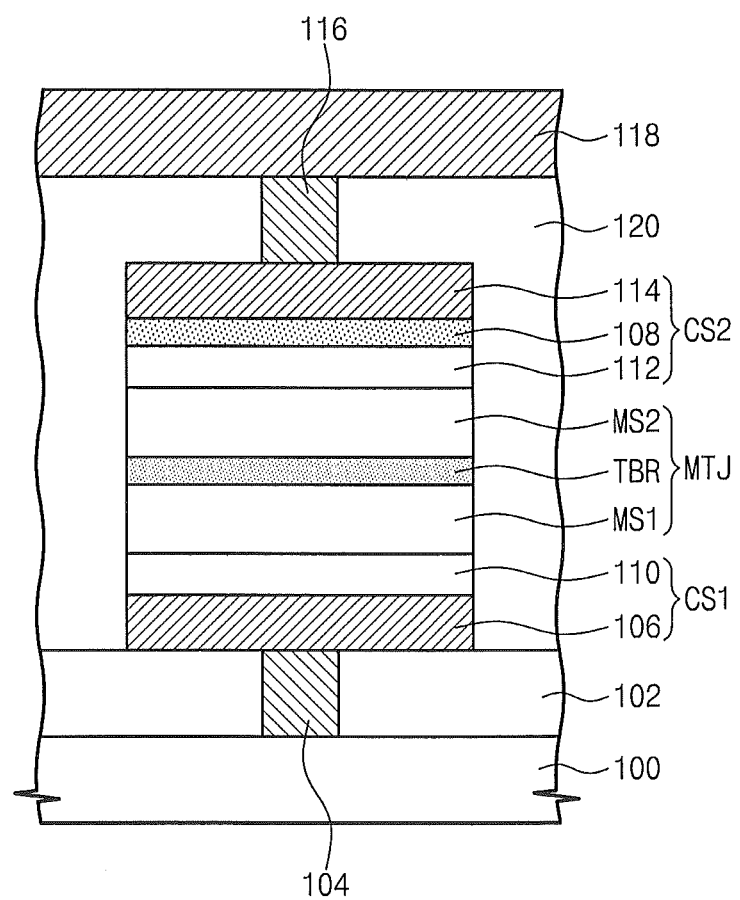
FIG. 5 is a cross-sectional view illustrating a magnetic memory device according to other embodiments of the inventive concepts.

FIG. 5 is a cross-sectional view illustrating a magnetic memory device according to other embodiments of the inventive concepts. In the present embodiment, the same components as described in the aforementioned embodiment of FIG. 4 will be described by the same reference numerals or the same reference designators. The descriptions to the same components will be omitted or mentioned briefly for the purpose of ease and convenience in explanation. Referring to FIG. 5, a first conductive structure CS1, a magnetic tunnel junction MTJ, and a second conductive structure CS2 may be sequentially stacked on the first dielectric layer 102. The first conductive structure CS1 may be electrically connected to the top surface of the lower contact plug 104. The first conductive structure CS1, the magnetic tunnel junction MTJ, and the second conductive structure CS2 may have sidewalls aligned with each other.

The first conductive structure CS1 may include a first electrode 106 on the first dielectric layer 102 and a seed layer 110 on the first electrode 106. The magnetic tunnel junction MTJ may include a first perpendicular magnetic structure MS1 on the seed layer 110, a second perpendicular magnetic structure MS2 on the first perpendicular magnetic structure MS1, and a tunnel barrier TBR between the first and second perpendicular magnetic structures MS1 and MS2. In more detail, the first perpendicular magnetic structure MS1 may be disposed between the seed layer 110 and the tunnel barrier TBR, and the second perpendicular magnetic structure MS2 may be disposed between the tunnel barrier TBR and the second conductive structure CS2. The second conductive structure CS2 may include a second electrode 114 on the second perpendicular magnetic structure MS2, a capping layer 112 between the second perpendicular magnetic structure MS2 and the second electrode 114, and a blocking layer 108 between the second electrode 114 and the capping layer 112.

The blocking layer 108 may include an amorphous metal compound. The blocking layer 108 may be in an amorphous state when deposited. The blocking layer 108 may not be crystallized by an annealing process performed after the deposition thereof. In other words, the amorphous state of the blocking layer 108 may be maintained after the annealing process. The blocking layer 108 of FIG. 5 is the same as the blocking layer 108 included in the magnetic memory device described with reference to FIG. 4.

Generally, the second electrode 114 may have a predetermined crystal structure and may be in contact with the capping layer 112. A crystal structure of the second electrode 114 may be transferred to the capping layer 112 and the magnetic tunnel junction MTJ by an annealing process performed after the second electrode 114 is deposited. Thus, the crystal structure of the second electrode 114 may influence a crystal structure and orientation of the magnetic tunnel junction MTJ. As a result, a tunnel magnetic resistance (TMR) characteristic of the magnetic tunnel junction MTJ may be deteriorated. Additionally, an exchange coupling characteristic between magnetic layers constituting the magnetic tunnel junction MTJ may also be deteriorated.

According to embodiments of the inventive concepts, the blocking layer 108 including the amorphous metal compound may not be crystallized by the annealing process performed after the deposition of the second electrode 114 such that the amorphous state of the blocking layer 108 may be maintained after the annealing process. Since the blocking layer 108 is disposed between the second electrode 114 and the capping layer 112, it is possible to prevent the crystal structure of the second electrode 114 from influencing the crystal structure and orientation of the magnetic tunnel junction MTJ through the capping layer 112 by the annealing process. As a result, the TRM characteristic of the magnetic tunnel junction MTJ may be improved. Additionally, the exchange coupling characteristic between the magnetic layers of the magnetic tunnel junction MTJ may also be improved.

Figure 6:
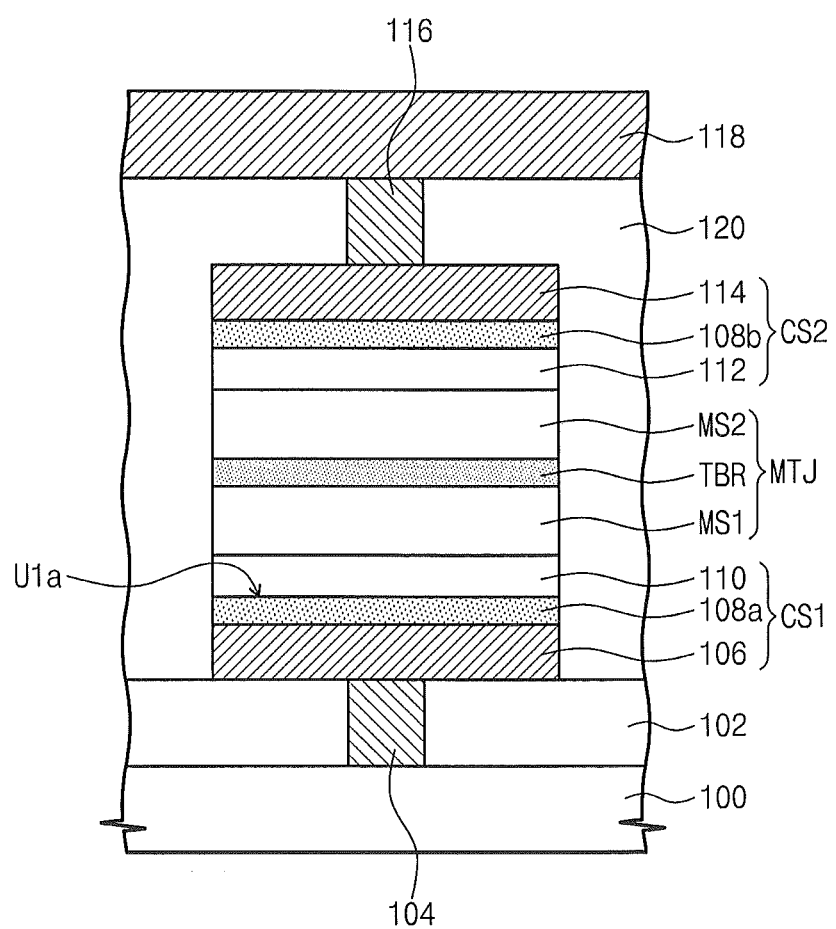
FIG. 6 is a cross-sectional view illustrating a magnetic memory device according to still other embodiments of the inventive concepts.

FIG. 6 is a cross-sectional view illustrating a magnetic memory device according to still other embodiments of the inventive concepts. In the present embodiment, the same components as described in the aforementioned embodiments of FIGS. 4 and 5 will be described by the same reference numerals or the same reference designators. The descriptions to the same components will be omitted or mentioned briefly for the purpose of ease and convenience in explanation. Referring to FIG. 6, a first conductive structure CS1, a magnetic tunnel junction MTJ, and a second conductive structure CS2 may be sequentially stacked on the first dielectric layer 102. The first conductive structure CS1 may include a first electrode 106 on the first dielectric layer 102, a seed layer 110 on the first electrode 106, and a first blocking layer 108a between the first electrode 106 and the seed layer 110. The magnetic tunnel junction MTJ may include a first perpendicular magnetic structure MS1 on the seed layer 110, a second perpendicular magnetic structure MS2 on the first perpendicular magnetic structure MS1, and a tunnel barrier TBR between the first and second perpendicular magnetic structures MS1 and MS2. In more detail, the first perpendicular magnetic structure MS1 may be disposed between the seed layer 110 and the tunnel barrier TBR, and the second perpendicular magnetic structure MS2 may be disposed between the tunnel barrier TBR and the second conductive structure CS2. The second conductive structure CS2 may include a second electrode 114 on the second perpendicular magnetic structure MS2, a capping layer 112 between the second perpendicular magnetic structure MS2 and the second electrode 114, and a second blocking layer 108b between the second electrode 114 and the capping layer 112.

Each of the first and second blocking layers 108a and 108b may include an amorphous metal compound. Each of the first and second blocking layers 108a and 108b may be in an amorphous state when deposited. Each of the first and second blocking layers 108a and 108b may not be crystallized by an annealing process performed after the deposition thereof. In other words, the amorphous state of each of the first and second blocking layers 108a and 108b may be maintained after the annealing process. Each of the first and second blocking layers 108a and 108b is the same as the blocking layer 108 included in the magnetic memory device described with reference to FIG. 4. The first blocking layer 108a may have a top surface U1a planarized by a planarization process performed after the deposition of the first blocking layer 108a and before the deposition of the seed layer 110.

According to embodiments of the inventive concepts, the blocking layer including the amorphous metal compound may not be crystallized but may be maintained in the amorphous state after the annealing process performed after deposition of the magnetic tunnel junction MTJ. If the blocking layer is disposed between the first electrode 106 and the seed layer 110, it is possible to prevent the crystal structure of the first electrode 106 from influencing the crystal structure and orientation of the magnetic tunnel junction MTJ through the seed layer 110 by the annealing process performed after the deposition of the magnetic tunnel junction MTJ. Additionally, if the blocking layer is disposed between the second electrode 114 and the capping layer 112, it is possible to prevent the crystal structure of the second electrode 114 from influencing the crystal structure and orientation of the magnetic tunnel junction MTJ through the capping layer 112 by the annealing process performed after the deposition of the second electrode 114. In other words, since the blocking layer prevents the crystal structures of the first and second electrodes 106 and 114 from influencing the crystal structure and orientation of the magnetic tunnel junction MTJ, the TRM characteristic and the exchange coupling characteristic of the magnetic tunnel junction MTJ may be improved. As a result, the magnetic memory devices having excellent reliability may be realized.

Figure 11:
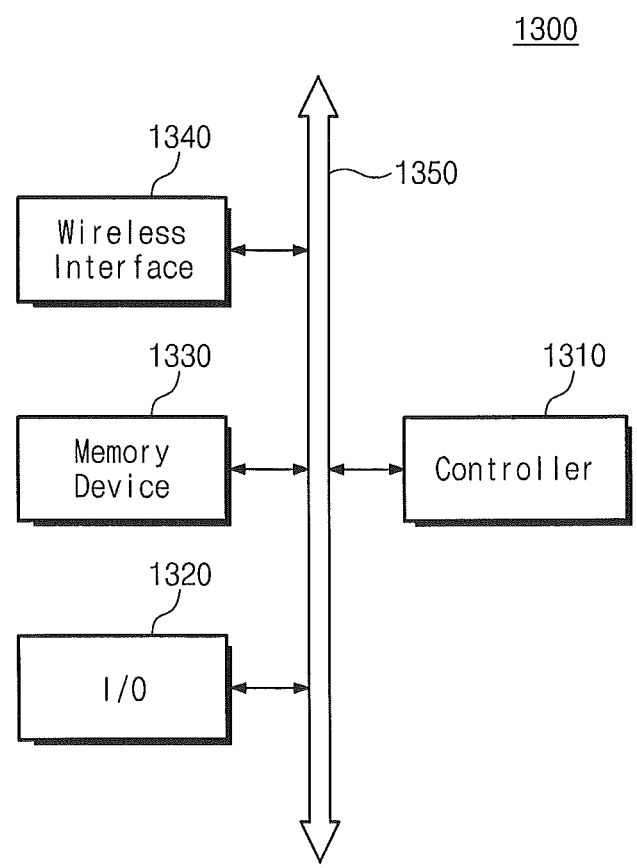
FIGS. 11 and 12 are schematic block diagrams illustrating electronic devices including magnetic memory devices according to embodiments of the inventive concepts.
Figure 12:
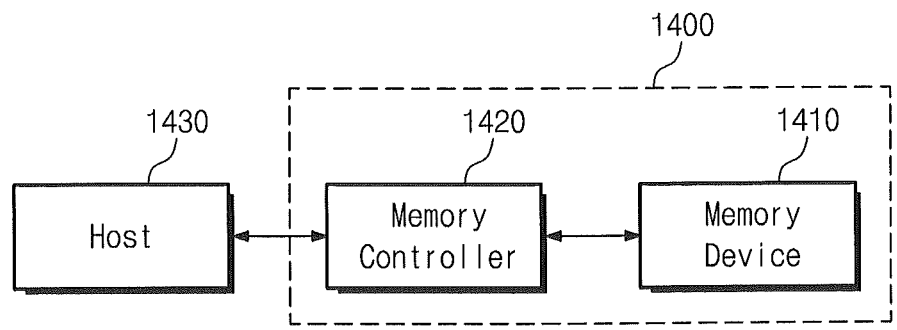

FIGS. 11 and 12 are schematic block diagrams illustrating electronic devices including magnetic memory devices according to embodiments of the inventive concepts. Referring to FIG. 11, an electronic device 1300 including the semiconductor device according to the inventive concepts may be one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 which are coupled to each other through a data bus 1350. For example, the controller 1310 may include at least one of a microprocessor, a digital signal processor, a microcontroller, or another logic device having a similar function to any one thereof. The memory device 1330 may store, for example, commands executed through the controller 1310. Additionally, the memory device 1330 may store user's data. The memory device 1330 may include at least one of the semiconductor devices (i.e., the magnetic memory devices) in the aforementioned embodiments of the inventive concepts. The electronic device 1300 may use the wireless interface unit 1340 in order to transmit data to a wireless communication network communicating with a radio frequency (RF) signal or in order to receive data from the network. For example, the wireless interface unit 1340 may include antenna or a wireless transceiver. The electronic device 1300 may be used in order to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 12, the semiconductor devices according to embodiments of the inventive concepts may be used in order to realize memory systems. A memory system 1400 may include a memory device 1410 and a memory controller 1420 for storing massive data. The memory controller 1420 may control the memory device 1410 in order to read/write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices (i.e., the magnetic memory devices) according to the above embodiments of the inventive concepts.

The semiconductor devices (i.e., the magnetic memory devices) described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

According to embodiments of the inventive concepts, the blocking layer including the amorphous metal compound may be disposed between the magnetic tunnel junction and the electrode. The blocking layer may prevent the crystal structure of the electrode from influencing the crystal structure and orientation of the magnetic tunnel junction. Thus, the TMR and exchange coupling characteristics of the magnetic tunnel junction may be improved. As a result, the magnetic memory devices having excellent reliability may be realized.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device, comprising:
   first and second perpendicular magnetic structures having a tunnel barrier layer therebetween;
   an electrode separated from the tunnel barrier layer by the first perpendicular magnetic structure; and
   a blocking layer extending between the first perpendicular magnetic structure and the electrode, said blocking layer comprising an amorphous metal compound.

2. The memory device of claim 1, wherein the blocking layer is a thermally treated layer; and wherein an amorphous state of the blocking layer is maintained during and post thermal treatment.

3. The memory device of claim 1, wherein the blocking layer comprises ferromagnetic, non-metal and non-magnetic metal elements.

4. The memory device of claim 3, wherein the ferromagnetic element is selected from a group consisting of cobalt, iron and nickel and combinations thereof; wherein the non-metal element is selected from a group consisting of boron and nitrogen and combinations thereof; and wherein the non-magnetic metal element is selected from a group consisting of tantalum (Ta), tungsten (W), niobium (Nb), titanium (Ti), chromium (Cr), zirconium (Zr), hafnium (Hf), molybdenum (Mo), aluminum (Al), magnesium (Mg), ruthenium (Ru) and vanadium (V) and combinations thereof.

5. The memory device of claim 3, wherein the blocking layer comprises cobalt-iron-boron-tantalum (CoFeBTa).

6. The memory device of claim 3, wherein a content ratio of the non-magnetic metal element in the blocking layer is in a range from about 15 wt % to about 50 wt %.

7. The memory device of claim 1, wherein the blocking layer has a thickness in a range from about 0.1 Å to about 20 Å.

8. The memory device of claim 1, further comprising a seed layer extending between the first perpendicular magnetic structure and the blocking layer; and wherein the blocking layer contacts the seed layer.

9. The memory device of claim 8, wherein the first perpendicular magnetic structure comprises:
   an exchange coupling layer extending between the tunnel barrier layer and the seed layer;
   a first magnetic layer having a fixed magnetization direction, extending between the tunnel barrier layer and the exchange coupling layer; and
   a second magnetic layer having a fixed magnetization direction, extending between the exchange coupling layer and the seed layer.

10. The memory device of claim 8, wherein the first perpendicular magnetic structure comprises a magnetic layer having a changeable magnetization direction, extending between the tunnel barrier layer and the seed layer.

11. The memory device of claim 1, wherein the electrode is a first electrode and the blocking layer is a first blocking layer; and wherein the memory device further comprises:
    a second electrode spaced apart from the tunnel barrier layer with the second perpendicular magnetic structure extending therebetween; and
    a second blocking layer extending between the second perpendicular magnetic structure and the second electrode, said second blocking layer comprising an amorphous metal compound.

12. The memory device of claim 11, further comprising:
    a seed layer extending between the first perpendicular magnetic structure and the first blocking layer; and
    a capping layer extending between the second perpendicular magnetic structure and the second blocking layer; and
    wherein the first blocking layer is in contact with a surface of the seed layer, and the second blocking is in contact with one surface of the capping layer.

* * * * *